(12) United States Patent
Jain et al.

(10) Patent No.: US 10,923,184 B2
(45) Date of Patent: Feb. 16, 2021

(54) DUAL RAIL SRAM DEVICE

(71) Applicant: Taiwan Semiconductor Manufacturing Company, Ltd., Hsinchu (TW)

(72) Inventors: Sanjeev Kumar Jain, Hsinchu (TW); Atul Katoch, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

(21) Appl. No.: 16/176,168

(22) Filed: Oct. 31, 2018

(65) Prior Publication Data

US 2019/0147942 A1 May 16, 2019

Related U.S. Application Data

(60) Provisional application No. 62/585,877, filed on Nov. 14, 2017.

(51) Int. Cl.
| | |
|---|---|
| *G11C 11/419* | (2006.01) |
| *G11C 11/418* | (2006.01) |
| *G11C 7/12* | (2006.01) |
| *G11C 7/22* | (2006.01) |
| *G11C 5/14* | (2006.01) |

(52) U.S. Cl.
CPC ............ *G11C 11/419* (2013.01); *G11C 5/147* (2013.01); *G11C 7/12* (2013.01); *G11C 7/222* (2013.01); *G11C 11/418* (2013.01)

(58) Field of Classification Search
CPC ......... G11C 11/419; G11C 5/147; G11C 7/12; G11C 7/222; G11C 11/418
USPC .......................................................... 365/156
See application file for complete search history.

(56) References Cited

U.S. PATENT DOCUMENTS

| | | | | |
|---|---|---|---|---|
| 2007/0002636 | A1* | 1/2007 | Campbell | G11C 5/143 |
| | | | | 365/189.04 |
| 2010/0238749 | A1* | 9/2010 | Kushida | G11C 11/419 |
| | | | | 365/203 |
| 2012/0294081 | A1* | 11/2012 | Mizuno | G11C 7/065 |
| | | | | 365/182 |
| 2016/0329094 | A1* | 11/2016 | Luan | H01L 21/8249 |
| 2017/0372773 | A1* | 12/2017 | Walker | G11C 11/419 |
| 2018/0083625 | A1* | 3/2018 | Garg | G11C 5/147 |

* cited by examiner

*Primary Examiner* — Fernando Hidalgo
(74) *Attorney, Agent, or Firm* — Merchant & Gould P C.

(57) ABSTRACT

An SRAM device has a voltage input terminal configured to receive a first signal at a first voltage level. A level shifter is connected to the voltage input terminal to receive the first signal, and the level shifter is configured to output a second signal at a second voltage level higher than the first voltage level. A memory cell has a word line and a bit line. The word line is connected to the output terminal of the level shifter to selectively receive the second signal at the second voltage level, and the bit line is connected to the voltage input terminal to selectively receive the first signal at the first voltage level. A sense amplifier is connected to the bit line and is configured to provide an output of the memory cell. The sense amplifier has a sense amplifier input connected to the output terminal of the level shifter to selectively receive the second signal at the second voltage level.

20 Claims, 5 Drawing Sheets

DUAL RAIL SRAM DEVICE

CROSS-REFERENCE TO RELATED APPLICATION

This application claims the benefit of U.S. Provisional Patent Application No. 62/585,877, filed on Nov. 14, 2017, which is incorporated reference in its entirety.

BACKGROUND

A common type of integrated circuit memory is a static random access memory (SRAM) device. A typical SRAM memory device has an array of memory cells. Each memory cell uses six transistors connected between an upper reference potential and a lower reference potential (typically ground) such that one of two storage nodes can be occupied by the information to be stored, with the complementary information stored at the other storage node. A "dual rail" SRAM architecture refers to an SRAM arrangement where the memory logic is operated in a low voltage domain, while the memory array is operated in the high voltage domain. Due to this, the memory leakage power is reduced significantly but the memory access time is impacted. The gain in leakage power increases as the difference in the high voltage and low voltage value increases. Since the memory array is operated in the high voltage domain, both word line and bit line would preferably be operated in the high voltage domain without impacting the static noise margin and write margin if the logic voltage is decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
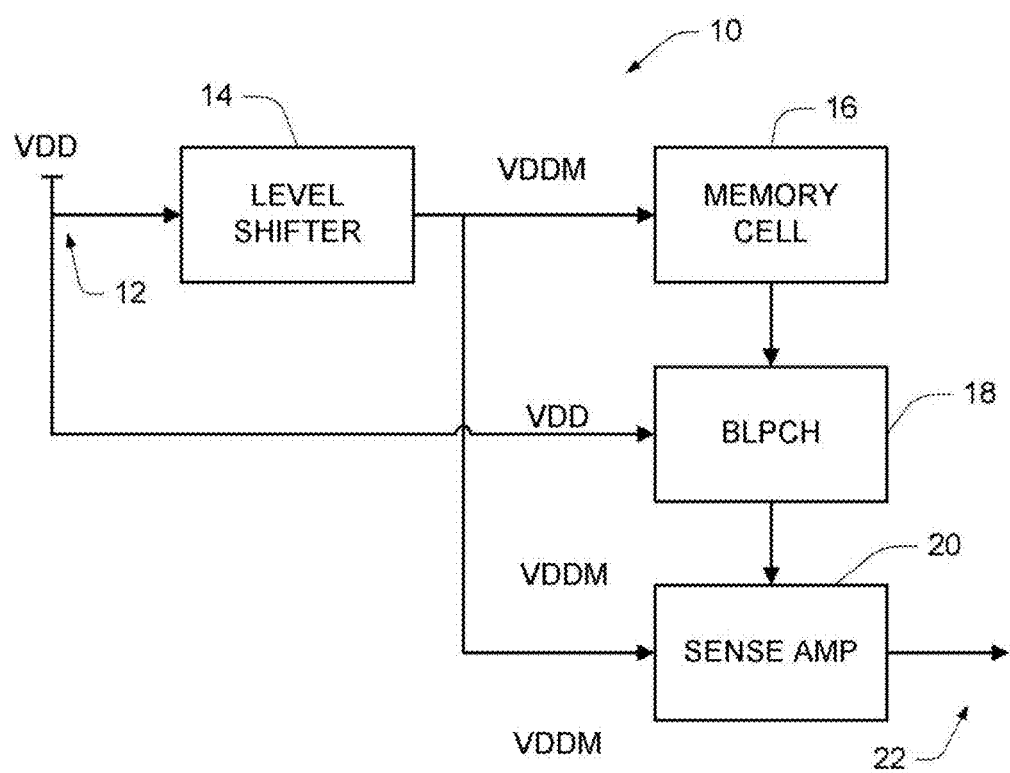
FIG. 1 is a block diagram illustrating aspects of an example static random access memory (SRAM) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information.

A "dual rail" SRAM architecture refers to an SRAM arrangement where the memory logic is operated in a low voltage domain, while the memory array is operated in a high voltage domain. Known dual rail SRAM arrangements can reduce memory leakage power, but memory access time can be adversely impacted. Further, as the difference between the voltage levels of the high and low voltage domains increases, leakage and noise may increase.

In accordance with some disclosed embodiments, word lines are operated in a high voltage domain while bit lines are operated in a low voltage domain in order to provide a desired static noise margin and write margin for the dual rail operation. Thus, power consumption is reduced while maintaining faster memory access. Still further, aspects of the disclosed devices and methods reduce read errors by providing a "race margin free" design, where the lag time between the word line disable and sense amplifier enable is minimized. In comparison, some known SRAM arrangements have a lag between disabling the word line and enabling the sense amplifier, resulting in the bit line floating, which can increase read errors.

FIG. 1 is a block diagram generally illustrating an example of a dual rail SRAM device 10 in accordance with certain aspects of the present disclosure. The illustrated SRAM device 10 includes a voltage input terminal 12 that receives a first signal at a first voltage level VDD. As noted previously, the memory array is operated at a high voltage level or high voltage domain. Thus, a level shifter 14 is connected to the voltage input terminal 12 to receive the first voltage signal at the VDD level and increase the received signal to a second, higher voltage level VDDM. A memory cell 16 is connected to the output of the level shifter 14 to receive the VDDM voltage. The memory cell 16 includes a word line and a bit line, and the word line is connected to the output of the level shifter 14 to selectively receive a signal at the higher voltage level VDDM to select the desired memory cell 16. As discussed further below, a bit line precharge 18 is connected to the voltage input terminal 12 to selectively receive the lower VDD signal.

A sense amplifier 20 is connected to the bit line of the memory cell 16 and is configured to provide an output of the memory cell 16 at an output terminal 22. The sense amplifier 20 has an input connected to the output of the level shifter 14 to selectively receive the VDDM voltage. Thus, both the word line of the memory cell 16 and the sense amplifier 20 are operated in the high voltage domain, receiving the higher voltage signal VDDM output by the level shifter 14, while the bit line precharge 18 is operated in the low voltage domain, receiving the lower voltage signal VDD input to the input terminal 12.

Figure 2:
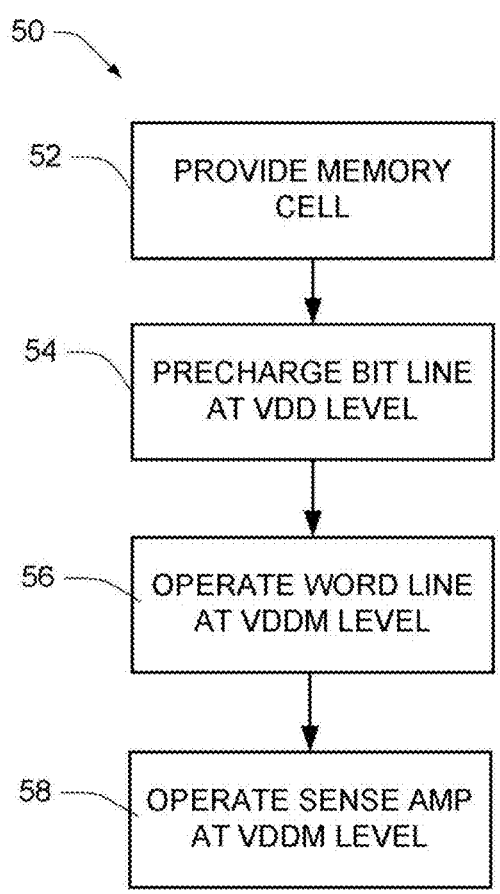
FIG. 2 is process flow diagram illustrating aspects of an example method for operating an SRAM device in accordance with some embodiments.

FIG. 2 is a process flow diagram generally illustrating a corresponding method 50 of operating an SRAM device, such as the SRAM 10 shown in FIG. 1. A memory cell is provided as indicated in block 52. As discussed further below, the memory cell, such as the SRAM memory cell 16 shown in FIG. 1, is a cell of a memory array containing a plurality of the memory cells 16. The memory cell 16 has a word line and a bit line, and a sense amplifier connected to the bit line configured to provide an output of the memory cell.

At block 54, the bit line of the memory cell is precharged to a first voltage level VDD, and the memory cell and sense amplifier are operated at a second voltage level VDDM that is higher than the first voltage level VDD, as shown in blocks 56 and 58.

Figure 3:
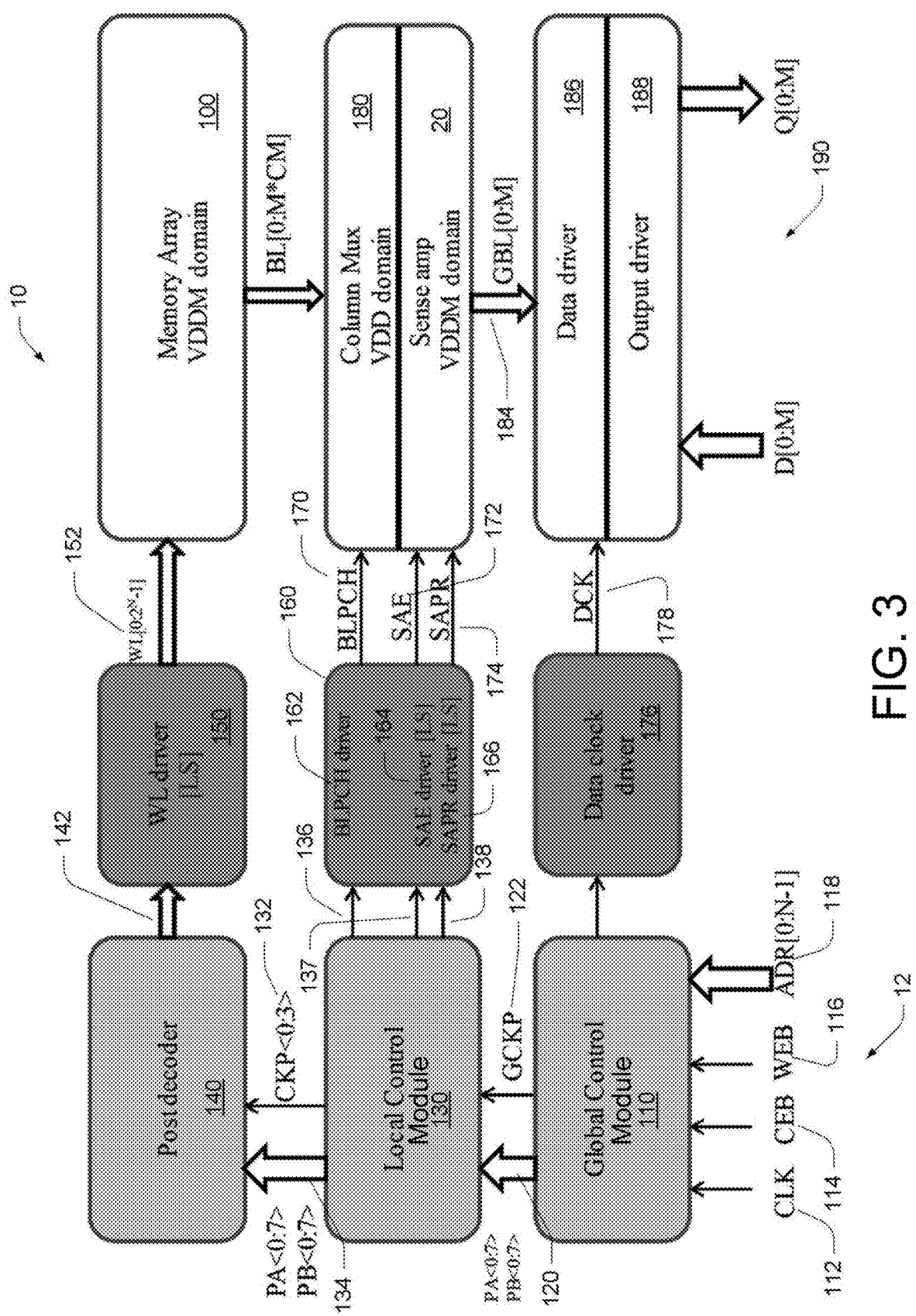
FIG. 3 is a block diagram illustrating further aspects of an example SRAM device in accordance with some embodiments.

FIG. 3 is a block diagram illustrating further aspects of the example SRAM device 10. A global control module 110 receives various input signals at one or more input terminals 12, including a clock signal 112, a chip enable signal 114, a write enable signal 116, and an address line signal 118. Some of the received input signals shown in FIG. 3 include a "B" suffix designating "bar" or active low signal. The input signals 12 may be at the low voltage level VDD. The global control module 110 functions to decode the memory address 120 from the address line signal 118, and generate an internal clock signal 122 used for read/write operations. The decoded address signal 120 and clock signal 122 are provided to a local control module 130, which generates a decoder clock signal 132 for a post decoder module 140, and also generates addresses 134 for the post decoder 140. The local control 130 further provides outputs 136 to a bit line driver 160 at the low voltage level VDD.

A word line driver 150 receives the output 142 of the post decoder 140. The word line driver 150 operates in the high voltage domain, outputting the word line signal 152 at the memory voltage level VDDM to the word line of the memory array 100. The memory array 100 includes a plurality of the memory cells 16, and the desired memory cell is selected via the word line signal 152. The "LS" label indicates the low voltage domain signal VDD level-shifted to the high voltage domain, having the second or higher voltage level VDDM.

A bit line driver module 160 includes a bit line precharge driver 162, a sense amplifier driver 164, and a sense amplifier enable driver 166. The bit line operates in the low voltage domain. Thus, the bit line precharge 162 outputs a bit line precharge signal 170 at the low voltage level VDD to a column multiplexer 180. In other words, the bit line of the memory cell 16 does not receive the signal output by the level shifter 14, but instead, is configured to receive the input voltage signal VDD that is received by the input terminal of the level shifter 14.

On the other hand, the sense amplifier 20 operates in the high voltage domain and therefore receives a sense amplifier enable signal 172 and sense amplifier precharge signal 174 at the high voltage level VDDM as output by the level shifter 14.

The sense amplifier 20 outputs the data 184 from the selected memory cell 16 of the memory array 100 to a data driver 186, and an output driver 188 provides the data output 190. A data clock driver 176 provides a data clock signal 178 to the data driver 186 to enable the data driver 186. The data clock signal 178 is also at the low voltage VDD level.

Figure 4:
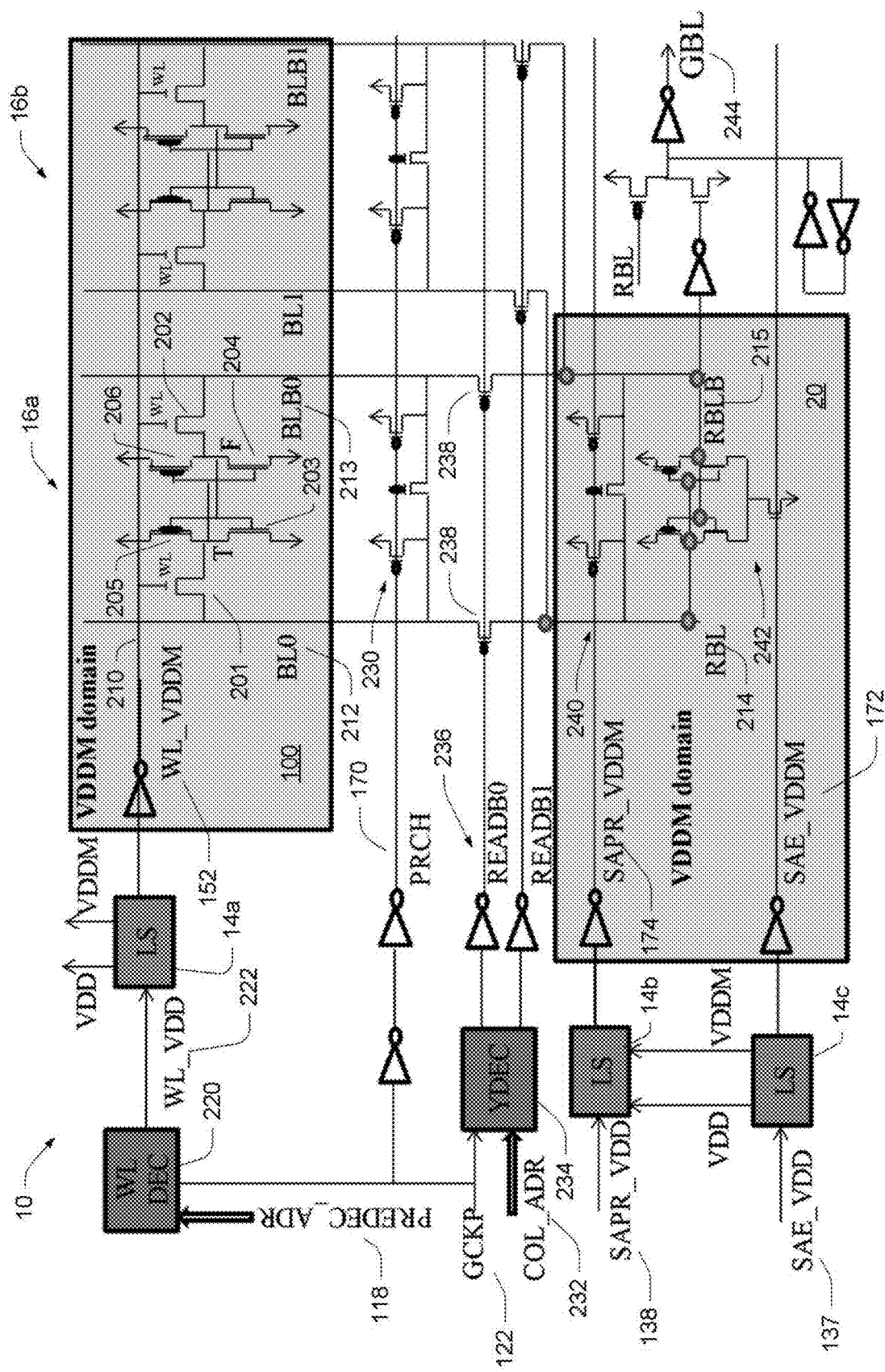
FIG. 4 is a circuit diagram illustrating further aspects of an example SRAM device in accordance with some embodiments.

FIG. 4 is a circuit diagram illustrating further aspects of the SRAM device 10 in accordance with some embodiments. As noted previously, the memory array 100 includes a plurality of memory cells 16. The SRAM memory array 100 shown in the example of FIG. 4 includes two representative SRAM memory cells 16a, 16b. The memory cells collectively are referred to as a memory cell 16. The memory cells 16a, 16b shown in FIG. 4 are six-transistor SRAM memory cells, though other SRAM memory cell arrangements could be employed in other embodiments. The SRAM memory cells 16a, 16b each have two n-channel metal oxide semiconductor (NMOS) transistors 201, 202 that function as connecting or switching transistors, having gate terminals connected to the word line 210. The remaining transistors 203-206 store data in the SRAM memory cell 10, and include two NMOS transistors 203, 204 and two p-channel metal oxide semiconductor (PMOS) transistors 205, 206 that form a latch to store the data. Data are passed to and from the latch to complementary bit lines 212, 213 via the switching transistors 201, 202 in response to a control signal 152 transmitted via the word line 210. The bit lines 212, 213 of each memory cell 16a, 16b are connected to a common bit line pair 214, 215 via column switches 238.

The address signal 118 is received at the lower voltage level VDD by a word line decoder 220, which outputs the word line signal 222 at the VDD level. The word line signal 222 at the low voltage VDD is received by a level shifter 14a, which outputs a word line control signal 152 at the high voltage level VDDM.

The PMOS transistors 205, 206 each have one of their source/drain terminals connected to a voltage source. In the illustrated example, the transistors 205, 206 are connected to the VDDM voltage level, since as noted previously, the memory array 100 is operated in the high voltage domain. The NMOS transistors 203, 204 each have one of their source/drain terminals connected to another voltage source, typically ground potential VSS.

The clock signal 122 converted to the bit line precharge signal 170 at the low voltage level VDD is received by the bit line precharge circuit 230, which is connected between the bit lines 212, 213 of respective memory cells 16. A column address signal 232 at the low voltage level VDD is received by a decoder 234 that is configured to output bit line read signals 236 to the column transistors 238 of the appropriate bit lines 212, 213. The bit line read signals 236 are not level shifted from the first voltage level VDD to the second, higher voltage level VDDM, and instead are applied to the corresponding bit lines 212, 213 of the appropriate memory cell 16 at the VDD level.

The column transistors 238 connect the appropriate bit lines 212, 213 to the common bit lines 214, 216 and the sense amplifier 20. The sense amplifier precharge signal 138 at the first voltage level VDD is received by a level shifter 14b, which outputs the sense amplifier precharge signal 174 at the VDDM level to the sense amplifier precharge circuit 240. The sense amplifier enable signal 137 is received by a level shifter 14c, which outputs the sense amplifier enable signal 172 at the VDDM level to the sense amplifier circuit 242. The sense amplifier circuit 242 senses the data signals from the memory cell and outputs a global bit line signal 244.

Aspects of various disclosed embodiments thus provide a dual rail SRAM device with improved memory cell access time, without significantly impacting power consumption. Further, lag time between word line disable (word line signal 152 going low) and sense amplifier enable (sense amplifier enable signal 172 going high) is minimized.

Figure 5:
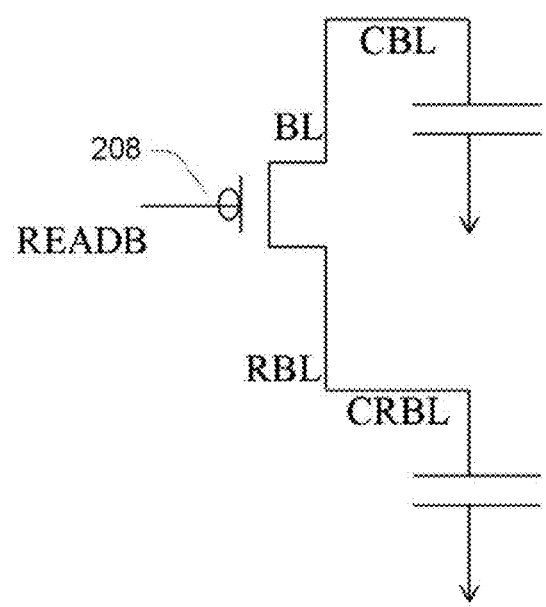
FIG. 5 is a circuit diagram illustrating an equivalent circuit of portions of an example SRAM device in accordance with some embodiments.

The difference between the second voltage level and first voltage level may be determined based on the particular given memory architecture and semiconductor technology. In some examples, the VDD voltage level is 0.5 volts, and the VDDM voltage level is 0.6 volts. FIG. 5 is a circuit diagram illustrating an equivalent circuit for portions of the SRAM device 10, including one memory cell bit line BL connected to a common bit line RBL by a column transistor 238. The bit line signal READB is applied to the gate of the column transistor 238. Capacitors CBL and CRBL represent portions of the memory cell to illustrate a charge sharing concept employed by disclosed examples.

As noted previously, the bit line is operated in the low voltage domain, i.e., at the VDD voltage level. The word line and sense amplifier are operated in the high voltage domain, i.e., at the higher VDDM level. If the bit line voltage drops by a voltage V1, the final voltage (Vf) is given as $$Vf=CBL*(VBL-V1)+CRBL*VRBL)/(CBL+CRBL)$$

Since the BL voltage has dropped by V1, RBL has to drop by V2

$$V2=VRBL-Vf$$

$$V2=Cr*(K+V1) \text{ where } Cr=CBL/(CBL+CRBL)$$

$$K=VRBL-VBL$$

In a typical dual rail SRAM sensing scheme $$VRBL=VBL=VDD$$

$$K=0$$

$$V2=Cr*V1$$

Since CBL>>CRBL=>Cr<1
So V2<V1

However, as disclosed herein, RBL is precharged at a higher voltage than BL e.g., $$VRBL=VDDM, VBL=VDD$$

$$K>0$$

$$V2=Cr*(K+V1)$$

Since CBL>>CRBL=>Cr<1
So V2>V1

In other words, the discharge rate of RBL is improved as compared to BL. Thus, aspects of the present disclosure provide a dual rail SRAM device that provides reduced power consumption, while improving access time.

Disclosed embodiments include an SRAM device that has a voltage input terminal configured to receive a first signal at a first voltage level. A level shifter is connected to the voltage input terminal to receive the first signal, and the level shifter is configured to output a second signal at a second voltage level higher than the first voltage level. A memory cell has a word line and a bit line. The word line is connected to the output terminal of the level shifter to selectively receive the second signal at the second voltage level, and the bit line is connected to the voltage input terminal to selectively receive the first signal at the first voltage level. A sense amplifier is connected to the bit line and is configured to provide an output of the memory cell. The sense amplifier has a sense amplifier input connected to the output terminal of the level shifter to selectively receive the second signal at the second voltage level.

In accordance with further disclosed embodiments, a method of operating an SRAM includes providing a memory cell with a word line, a bit line, and a sense amplifier connected to the bit line. The sense amplifier is configured to provide an output of the memory cell. The bit line is precharged at a first voltage level. The memory cell and the sense amplifier are operated at a second voltage level, where the second voltage level is greater than the first voltage level.

In accordance with still further disclosed embodiments, a method of operating an SRAM device includes receiving an address signal at a first voltage level, decoding the address signal into a word line signal and a bit line signal at the first voltage level, level shifting the word line signal to a second voltage level higher than the first voltage level, and outputting the word line signal at the second voltage level to a word line to select a memory cell of a memory array having a plurality of the memory cells. A bit line of the selected memory cell is precharged at the first voltage level, and the bit line signal at the first voltage level is output to the bit line. A sense amplifier signal is received at the first voltage level, and the received sense amplifier signal is level shifted to the second voltage level. The sense amplifier signal at the second voltage level is output to an input of a sense amplifier connected to the bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) device, comprising:
   a voltage input terminal configured to receive a first signal at a first voltage level;
   a level shifter connected to the voltage input terminal to receive the first signal and an output terminal configured to output a second signal at a second voltage level higher than the first voltage level;
   a memory cell including a word line and first and second bit lines, the word line connected to the output terminal of the level shifter to selectively receive the second signal at the second voltage level;
   a bit line precharge circuit having a control terminal configured to receive the first signal at the first voltage level to selectively precharge the first and second bit lines to the first voltage level in response to the first signal;

a bit line select circuit connected to the first and second bit lines and having a control terminal configured to receive the first signal at the first voltage level and output a bit line read signal at the first voltage level, wherein the bit line read signal is based on a clock signal and a column address signal;

first and second common bit lines connected to an output of the bit line select circuit, wherein the bit line select circuit is configured to selectively connect the first and second bit lines to the respective first and second common bit lines in response to the first signal;

a sense amplifier having a data input connected to the first and second common bit lines and configured to provide an output of the memory cell to a global bit line, the sense amplifier having a sense amplifier control input connected to the output terminal of the level shifter to selectively receive a sense amplifier enable signal at the second voltage level;

a sense amplifier precharge circuit connected to the first and second common bit lines and configured to precharge the first and second common bit lines to the second voltage level such that a discharge rate of the first and second common bit lines is higher than a discharge rate of the first and second bit lines; and a circuit having a first input connected to the first common bit line and a second input connected to the second common bit line, wherein the circuit is configured to output the output of the memory cell into a latch connected to the global bit line.

2. The SRAM device of claim 1, wherein the sense amplifier control input comprises at least one of a precharge input connected to the output terminal of the level shifter to selectively receive the second signal at the second voltage level, and an enable input connected to the output terminal of the level shifter to selectively receive the second signal at the second voltage level.

3. The SRAM device of claim 1, wherein the first signal includes a bit line precharge signal at the first voltage level, and wherein the control terminal of the bit line precharge circuit is configured to receive the bit line precharge signal at the first voltage level.

4. The SRAM device of claim 1, wherein the first signal includes an address signal at the first voltage level, and wherein the level shifter is configured to output a second address signal at the second voltage level.

5. The SRAM device of claim 1, wherein the sense amplifier precharge circuit includes a control terminal configured to receive a sense amplifier precharge signal at the second voltage level.

6. The SRAM device of claim 1, wherein the sense amplifier is configured to receive a first sense amplifier enable signal at the first voltage level, and wherein the level shifter is configured to output the sense amplifier enable signal at the second voltage level.

7. The SRAM device of claim 4, further comprising a word line decoder configured to receive the address signal at the first voltage level.

8. The SRAM device of claim 1, wherein the level shifter comprises a plurality of level shifters, wherein the first signal comprises a plurality of first signals at the first voltage level, and wherein each of the level shifters is configured to receive a respective one of the plurality of first signals at the first voltage level and output the second signal at the second voltage level.

9. The SRAM device of claim 1, further comprising a plurality of the memory cells arranged in a memory array, wherein the first signal includes an address of a selected memory cell in the memory array.

10. A method of operating a static random access memory (SRAM) device, comprising:

providing a memory cell including a word line and first and second bit lines;

providing first and second common bit lines selectively connected to the respective first and second bit lines;

providing a bit line select circuit connected to the first and second bit lines and having a control terminal configured to receive a first signal at a first voltage level;

outputting, from the bit line select circuit, a bit line read signal at the first voltage level, wherein the bit line read signal is based on a clock signal and a column address signal;

providing a sense amplifier having a data input connected to the first and second common bit lines and configured to provide an output of the memory cell;

providing a level shifter;

receiving the column address signal at the first voltage level by the level shifter;

outputting the column address signal at a second voltage level from the level shifter to the word line;

precharging the first and second bit lines to the first voltage level in response to a bit line precharge signal at the first voltage level;

precharging the first and second common bit lines to the second voltage level in response to a sense amplifier precharge signal at the second voltage level, where the second voltage level is greater than the first voltage level, such that a discharge rate of the first and second common bit lines is higher than a discharge rate of the first and second bit lines;

providing a circuit having a first input connected to the first common bit line and a second input connected to the second common bit line; and outputting the output of the memory cell into a latch connected to a global bit line by the circuit.

11. The method of claim 10, further comprising:
providing the output of the memory cell to a global bit line.

12. The method of claim 10, further comprising:
providing a decoder; and
outputting a bit line read signal at the first voltage level from the decoder.

13. The method of claim 10, wherein precharging the common bit line to a second voltage level includes:
receiving a first sense amplifier precharge signal at the first voltage level by the level shifter; and
outputting the sense amplifier precharge signal at the second voltage level from the level shifter to a sense amplifier control terminal.

14. The method of claim 10, further comprising:
receiving a first sense amplifier enable signal at the first voltage level by the level shifter; and
outputting a sense amplifier enable signal at the second voltage level from the level shifter to a sense amplifier control input.

15. The method of claim 10, wherein precharging the bit line to the first voltage level includes:
receiving the clock signal at the first voltage level; and
outputting the clock signal at the first voltage level to a bit line precharge circuit between the memory cell and the sense amplifier.

16. The method of claim 10, further comprising:
receiving a bit line read signal at the first voltage level; and outputting the bit line read signal at the first voltage level to a gate terminal of a transistor between the bit line and the sense amplifier to connect the common bit line to the bit line.

17. A method of operating a static random access memory (SRAM) device, comprising:
  receiving an address signal at a first voltage level;
  decoding the address signal into a word line signal and a bit line signal at the first voltage level;
  level shifting the word line signal to a second voltage level higher than the first voltage level;
  outputting the word line signal at the second voltage level to a word line to select a memory cell of a memory array having a plurality of the memory cells;
  precharging first and second bit lines of the selected memory cell to the first voltage level in response to a bit line precharge signal at the first voltage level;
  outputting a bit line read signal at the first voltage level to the first and second bit lines, wherein the bit line read signal at the first voltage level is based on a clock signal and the bit line signal;
  connecting first and second common bit lines to the respective first and second bit lines;
  receiving a sense amplifier precharge signal at the first voltage level;
  level shifting the sense amplifier precharge signal to the second voltage level;
  precharging the first and second common bit lines to the second voltage level in response to the sense amplifier precharge signal at the second voltage level, such that a discharge rate of the first and second common bit lines is higher than a discharge rate of the first and second bit lines;
  receiving a sense amplifier enable signal at the first voltage level;
  level shifting the sense amplifier enable signal to the second voltage level;
  providing a circuit having a first input connected to the first common bit line and a second input connected to the second common bit line; and
  providing by the circuit the output of the memory cell to a latch connected to a global bit line.

18. The method of claim 17, wherein a difference between the second voltage level and first voltage level is determined based on a memory architecture and semiconductor technology.

19. The method of claim 17, further comprising:
  outputting the output of the memory cell to the global bit line in response to the sense amplifier enable signal at the second voltage level.

20. The method of claim 17, further comprising:
  outputting the bit line read signal at the first voltage level to a gate terminal of a transistor between the bit line and the sense amplifier to connect the common bit line to the bit line.

* * * * *